(12) United States Patent
Huang

(10) Patent No.: US 7,368,936 B2
(45) Date of Patent: May 6, 2008

(54) IMPEDANCE MATCH CIRCUIT

(75) Inventor: Chun-Yi Huang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 11/308,788

(22) Filed: May 4, 2006

(65) Prior Publication Data

US 2007/0194967 A1 Aug. 23, 2007

(30) Foreign Application Priority Data

Feb. 22, 2006 (TW) .............................. 95105882 A

(51) Int. Cl.
*H03K 17/16* (2006.01)
(52) U.S. Cl. ....................................................... 326/30
(58) Field of Classification Search ................... 326/30
See application file for complete search history.

(56) References Cited

U.S. PATENT DOCUMENTS

| | | | |
|---|---|---|---|
| 6,560,290 B2 | 5/2003 | Ahn et al. ................... 375/259 |
| 6,937,055 B2* | 8/2005 | Roy et al. ...................... 326/30 |
| 6,940,303 B2* | 9/2005 | Vargas .......................... 326/30 |
| 7,196,540 B2* | 3/2007 | Ueno ............................ 326/30 |
| 2004/0090239 A1* | 5/2004 | Ikeoku et al. .................. 326/30 |
| 2006/0071683 A1* | 4/2006 | Best et al. ..................... 326/30 |
| 2006/0132171 A1* | 6/2006 | Nguyen ........................ 326/30 |

* cited by examiner

*Primary Examiner*—Vibol Tan
*Assistant Examiner*—Thienvu V Tran
(74) *Attorney, Agent, or Firm*—Jianq Chyun IP Office

(57) ABSTRACT

An impedance match circuit having high precision without being affected by variations in manufacturing processes. The impedance match circuit includes an impedance detect circuit, a current comparator, successive approximation controller, and an impedance combination circuit. The impedance detect circuit detects an external impedance. The impedance combination circuit outputs an output impedance. The current comparator compares currents from the impedance detect circuit and the impedance combination circuit. The successive approximation controller realizes whether the output impedance achieves a corresponding impedance match value of the external impedance by the current comparator. If the output impedance does not achieve the desired impedance value, the successive approximation controller will sequentially control the impedance adjusting mechanism in the impedance combination circuit to change output impedance of combination impedance circuit for achieving the desired impedance value corresponding to the external impedance.

13 Claims, 6 Drawing Sheets

IMPEDANCE MATCH CIRCUIT

CROSS-REFERENCE TO RELATED APPLICATION

This application claims the priority benefit of Taiwan application serial no. 95105882, filed on Feb. 22, 2006. All disclosure of the Taiwan application is incorporated herein by reference.

BACKGROUND OF THE INVENTION

1. Field of Invention

The present invention relates to an impedance match circuit. More particularly, the present invention relates to an impedance match circuit having high precision without being affected by variations in manufacturing processes.

2. Description of Related Art

The impedance match circuit is applied in various fields. For example, when high-speed data are transmitted through a transmission line, an extremely high frequency results in a very short wavelength, thus generating a significant electromagnetic wave effect. If the input unit impedance, the transmission line characteristic impedance, and the output unit impedance are not matched, the process of data transmission will generate a reflection interference phenomenon due to an electromagnetic wave effect, and power cannot be completely transferred. This phenomenon can be effectively reduced or eliminated by using the impedance match circuit. The conventional impedance match circuit has many disadvantages such as having too many elements and being of low precision. The redundant elements result in increased circuit area and unnecessary power consumption.

U.S. Pat. No. 6,560,290 discloses a complementary metal oxide semiconductor driver and a chip impedance match circuit for high-speed data communication. FIG. 1 is a circuit diagram of this impedance match circuit. In FIG. 1, resistors R11, R12, R13, and R14 are connected in series to divide the voltage of voltage source VCC and output it to operational amplifiers OP11, OP12, OP13. The operational amplifiers OP11, OP12, and OP13 connect two ends of the transistors 101, 106, and 109, and drive the operational amplifiers OP11, OP12, and OP13 by inputting voltage. The transistors 101, 104, 106, and 109 and the corresponding transistors 102 and 103, 105, 107 and 108, 110 and 111 form current mirrors. The source and drain of the transistor 101 are conducted, thus generating a current flowing through an applied resister R1e. The current is mirrored to the transistors 102, 103, and the current flowing through the transistors 102, 103 further flows through the transistors 104, 106 respectively and then is mirrored respectively to the transistor 105 and the transistors 107 and 108. The current flowing through the transistor 105 is mirrored to the transistors 110, 111 via the transistor 109. Thus, the equivalent impedance of the receiving ends RX+ and RX− is the impedance of the applied resistor R1e.

The conventional circuit has a disadvantage that too many operational amplifiers result in a complicated layout and sensitivity to offset voltage, and thus it is difficult to achieve consistency of manufacturing processes. Meanwhile, as the equivalent resistance is simulated by a transistor, the channel modulation effect and the substrate parasitic effect are likely to occur, such that the high-frequency effect is limited.

ROC Patent Publication No. 538602 discloses another conventional impedance match circuit. FIGS. 2A and 2B are circuit diagrams of this conventional impedance circuit. An operational amplifier OP20 receives a reference voltage VB to conduct the transistor 201, so as to generate a current (with a current value of VB/R2e) flowing through an external resistor R2e. The transistor 202 mirrors the current to the transistors 203_1~203_n. The resistor R22 is controlled by a switch SW to form a different resistor group together with the resistor R21. Taking the resistor R21 connected to the transistor 203_3 and two resistors R22 as an example, the resistor R21 is connected parallel with two resistors R22 via two switches SW. In the way of parallel connection, the equivalent impedance of this group drops due to the parallel connected resistors R22, thus generating a low voltage difference that is compared with voltage VB by the operational amplifier OP21_3. Other resistor groups may be deduced by analogy. After comparing different voltages with voltage VB, the operational amplifiers OP21_1~OP21_n output signals T21_1~T21_n to control the switches SW21_1~SW21_n as shown in FIG. 2B. For example, when the signals T21_1~T21_2 are 1 and T21_3~T21_n are 0, the impedance value of the resistor R2e is regarded as a value most approximate to the equivalent resistance of the resistor R21 connected parallel with a resistor R22. At this moment, the switch SW21_1 is on, such that the resistor R23 and one resistor R24 generate the desired match resistance value at output terminals VX and VY. The disadvantage of this conventional circuit lies in that the number of elements is large, resulting in increased circuit size.

ROC Patent Publication No. 538602 further discloses a conventional impedance match circuit. FIGS. 3A and 3B are circuit diagrams thereof. An operational amplifier OP30 receives a reference voltage VB that is input to the transistor 301, thus generate a current flowing through the external resistor R3e. The width-length ratio of the transistor 305 and 309 is p:q, and any width-length ratio of the transistor 305 and 307 is p:1. A control timing generator 350 turns on the switches SW31_1~SW31_n in sequence, such that the ratio of the current flowing though the resistor R3e to the current flowing through the resistor RO is p+x/q (x is the number of ON-state switch SW31). The current generated by the transistor 309 generates a voltage drop at the resistor RO, i.e., a voltage VO is generated at the position where the operational amplifier OP31 is connected. The operational amplifier OP31 compares voltage VB with voltage VO, and stores the compared result to the register units 321_0~321_n. The output signals TS_0~TS_n of the register units 321_0~321_n can control the switches SW32_0~SW32_n of FIG. 3B, and thus the resistor R33 and the resistor R34 generate a match resistance value most related to the resistor R3e at the output terminals VX and VY. Although this conventional circuit is relatively simple, the mechanism for comparing voltages is still complicated, and the precision may be reduced when matched with transistors.

SUMMARY OF THE INVENTION

The present invention provides an impedance match circuit, which provides a built-in resistor in fixed proportion to the external resistor. A proper auto-correct mechanism may protect the impedance value from being affected by manufacturing process, temperature, and voltage. The impedance match circuit can also be applied in a data transmission system to effectively improve the data transmission effect.

Based on the above-mentioned and other objects, the present invention provides an impedance match circuit which generates an impedance match value related to the external impedance. The impedance match circuit includes an impedance detect circuit, a current comparator, a successive approximation controller, and an impedance combination circuit. The impedance detect circuit detects the external impedance to obtain a first impedance in proportion to the external impedance for outputting a first current. The current comparator responds to the first current and a second current flowing through the external impedance, thus generating a compared result. The successive approximation controller controls the first impedance of the impedance detect circuit according to the compared result of the current comparator, so as to obtain the desired first impedance. The impedance combination circuit replicates the impedance combination structure of the impedance detect circuit, so as to obtain an impedance match value in proportion to the external impedance. The ratio of the first impedance to the external impedance is equal to the ratio of the impedance match value to the external impedance.

Based on the above-mentioned and other objects, the present invention further provides a signal receiver, which includes an impedance match circuit for generating an impedance match value related to the external impedance. The impedance match circuit includes an impedance detect circuit, a current mirror, a current comparator, a successive approximation controller, and an impedance combination circuit. The impedance detect circuit detects the external impedance to obtain a first impedance in proportion to the external impedance, and outputs a first current. The current mirror is used to mirror a second current flowing through the external impedance to obtain a third current in proportion to different width-length ratios of transistors. The current comparator compares the first current and the third current to generate a compared result and input it to the successive approximation controller. The successive approximation controller adjusts the first impedance of the impedance detect circuit according to the compared result of the current comparator to obtain the desired first impedance in proportion to the external impedance after adjustment. The impedance combination circuit replicates the impedance combination structure of the impedance detect circuit to obtain an impedance match value in proportion to the external impedance.

In order to make the aforementioned and other objects, features and advantages of the present invention comprehensible, preferred embodiments accompanied with figures are described in detail below.

It is to be understood that both the foregoing general description and the following detailed description are exemplary, and are intended to provide further explanation of the invention as claimed.

DESCRIPTION OF EMBODIMENTS

Figure 1:
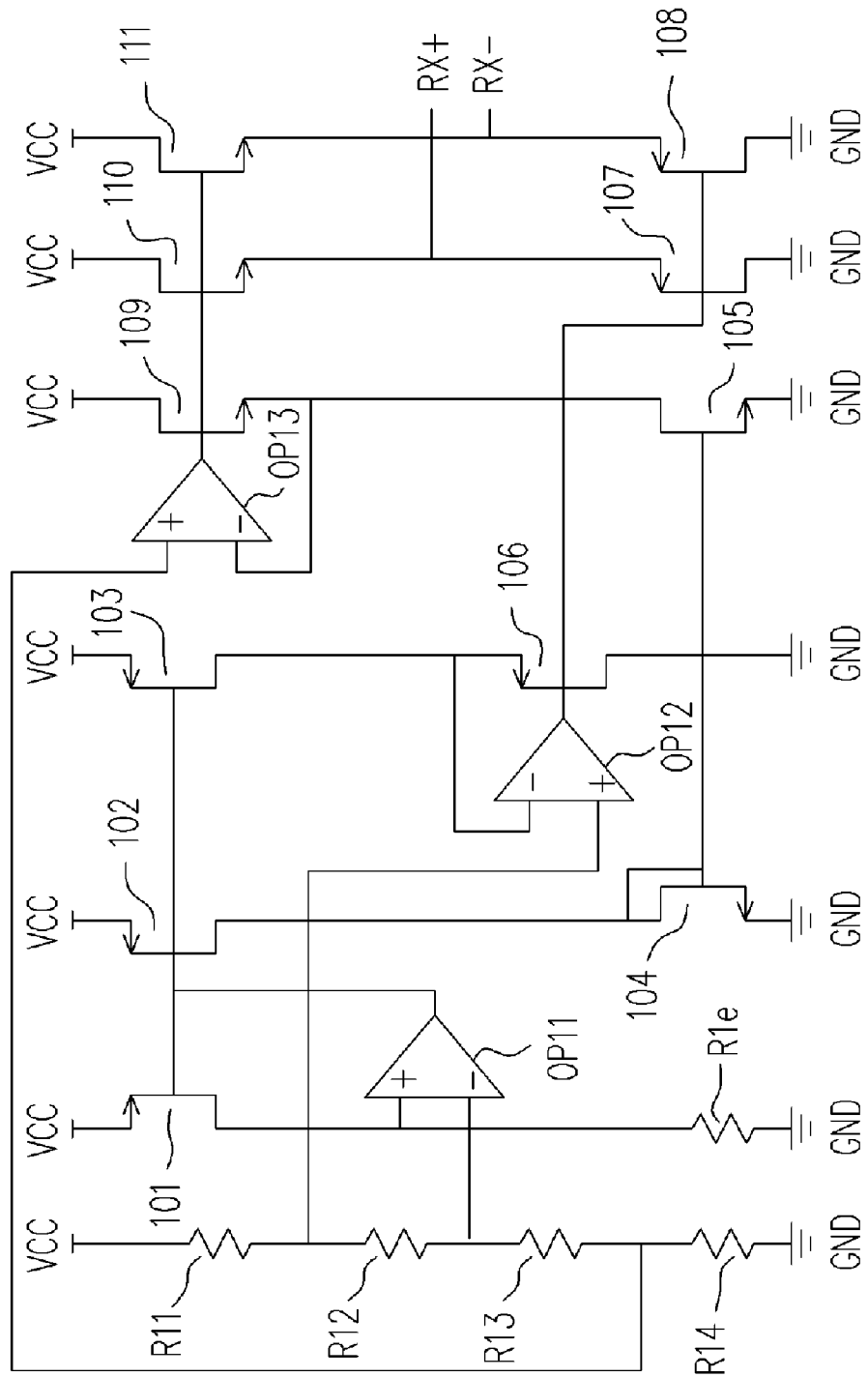
FIG. 1 shows a circuit diagram of a conventional impedance match circuit.
Figure 2A:
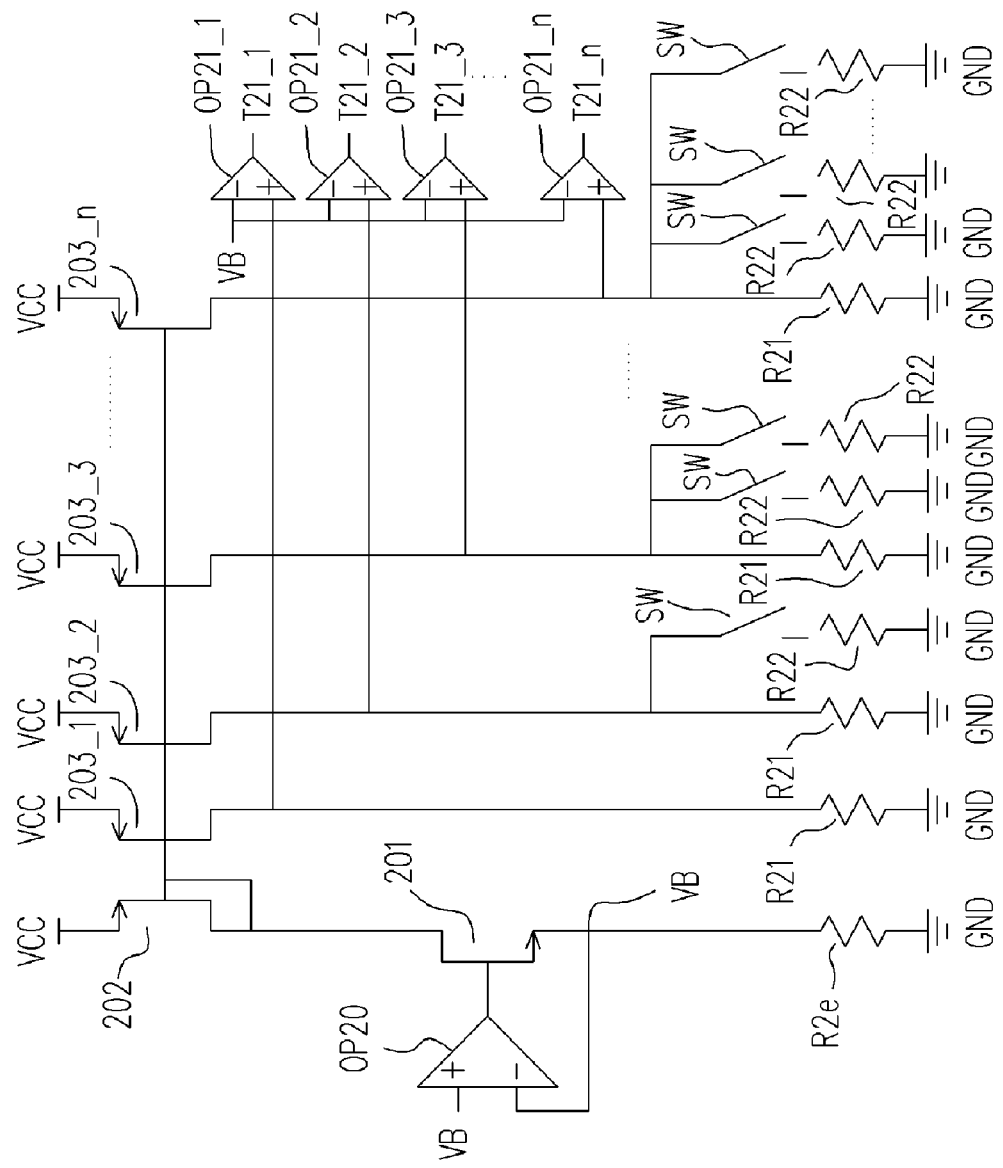
FIGS. 2A and 2B show circuit diagrams of another conventional impedance match circuit.
Figure 2B:
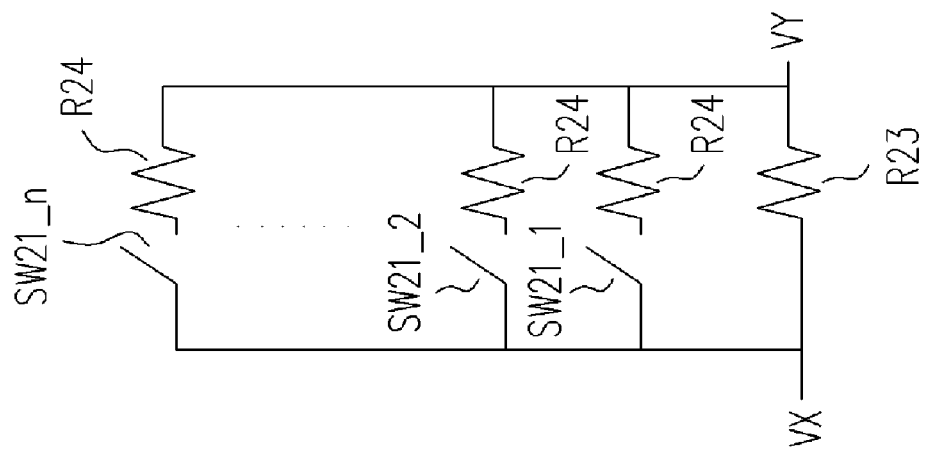
Figure 3A:
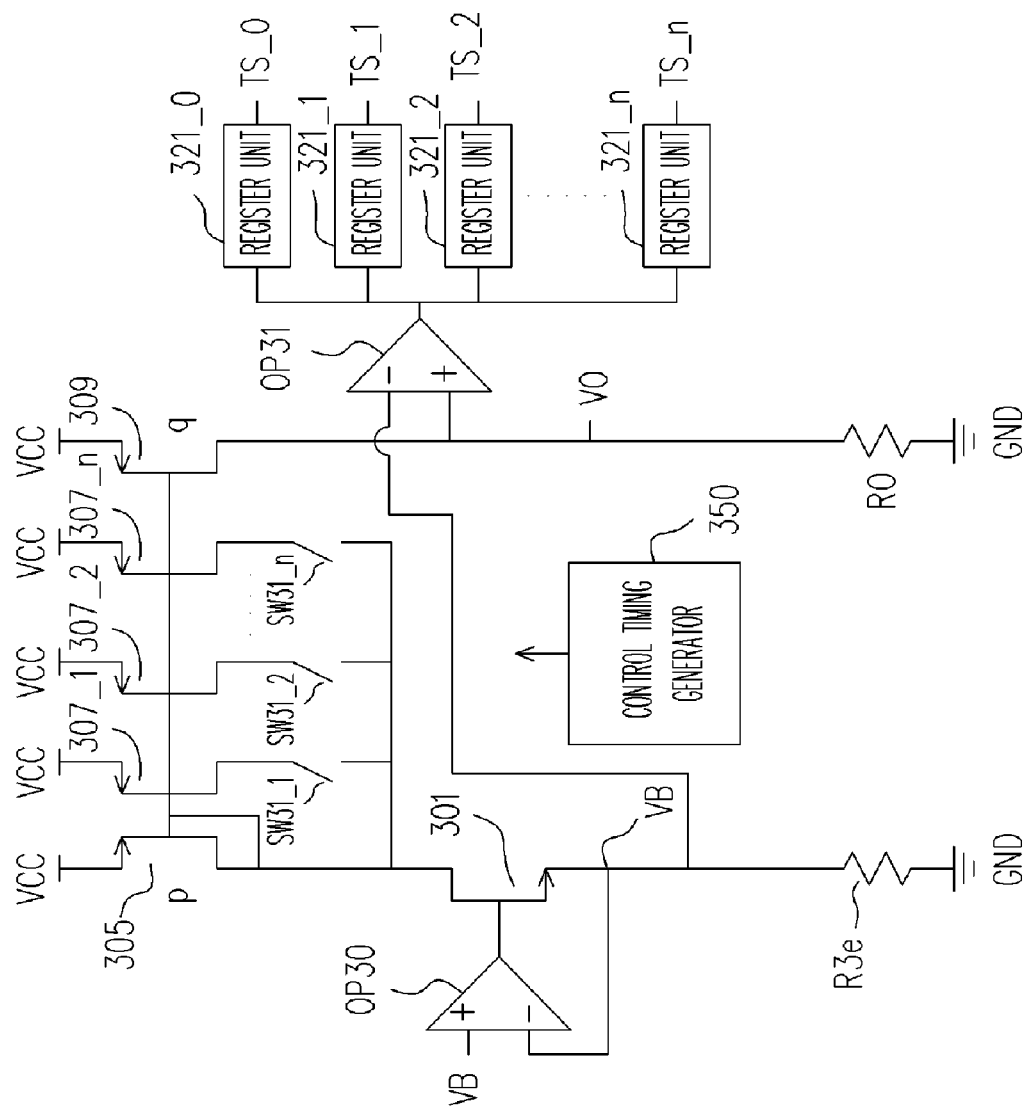
FIGS. 3A and 3B show circuit diagrams of still another conventional impedance match circuit.
Figure 3B:
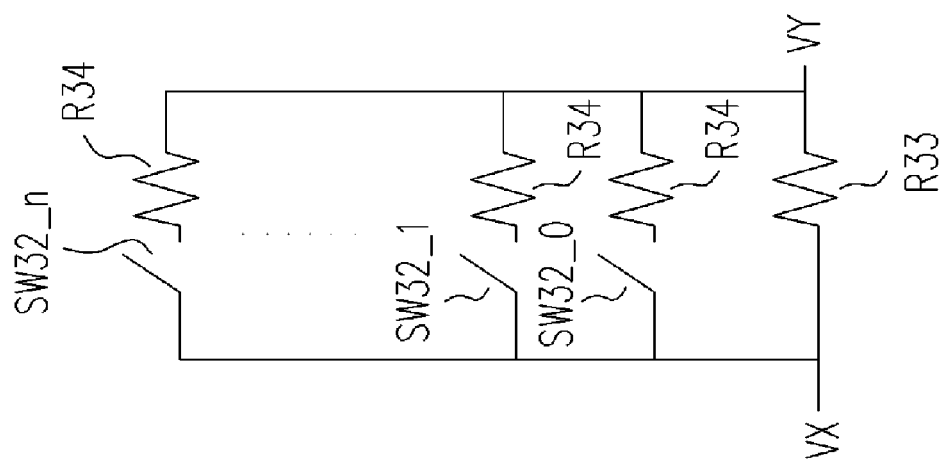
Figure 4:
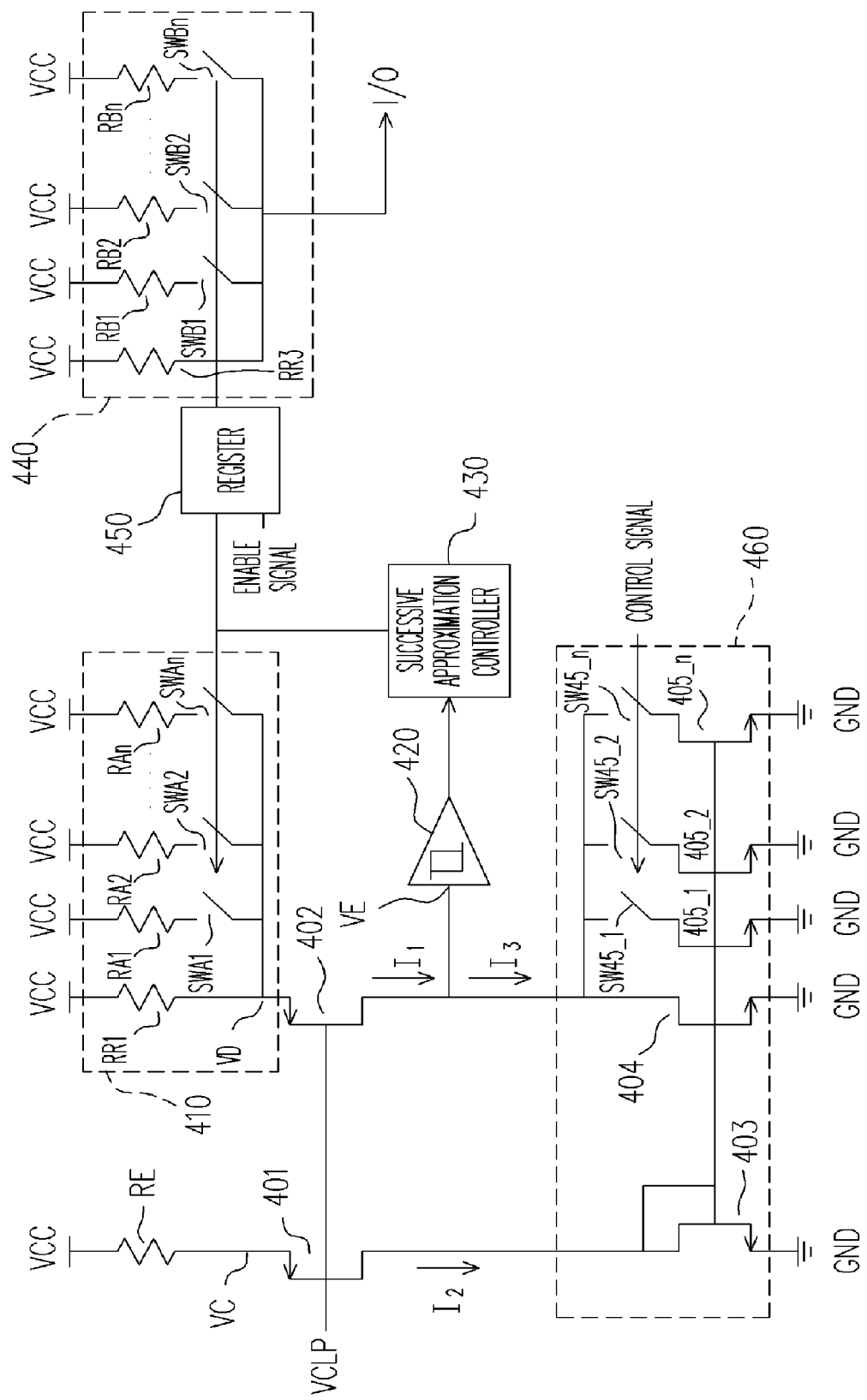
FIG. 4 shows a circuit diagram of an impedance match circuit having high precision without being affected by variations in manufacturing processes according to an embodiment of the present invention.

FIG. 4 is a circuit diagram of an impedance match circuit having high precision without being affected by fluctuations in manufacturing processes according to an embodiment of the present invention. The impedance match circuit according to the embodiment of the present invention includes an impedance detect circuit 410, a current comparator 420, a successive approximation controller 430, an impedance combination circuit 440, a register 450, a current mirror 460, and voltage clamping transistors 401 and 402. In this embodiment, the impedance detect circuit 410 detects and combines an impedance value in proportion to the applied resistor within an impedance detect range. The adjustment of the impedance detect value involves outputting a comparing signal to the successive approximation controller 430 after the comparison of the comparator 420, so as to adjust the combination structure of the switch and resistor of the impedance detect circuit 410 and thus the impedance detect value is adjusted to be a certain multiple of the applied resistor RE. The register 450 replicates the impedance detect value to the impedance combination circuit 440, and the value becomes an impedance match value. As the desired resistance value is gradually approached, the errors of impedance match are reduced. It is easy to achieve this match structure, and the number of elements is greatly reduced. Meanwhile, the correct mechanism of the current comparator 420 in combination with the successive approximation controller 430 has a high precision. The impedance detect circuit 410 and the impedance combination circuit 440 have the same impedance architecture, so the impedance match value will not be affected by temperature, manufacturing process, and voltage.

The impedance detect circuit 410 detects the impedance of the external resistor RE, combines it into an impedance value in proportion to the impedance of the external resistor RE, and further outputs a first current I1. One end of the resistor RE is coupled to the source end of the voltage clamping transistor 401, and the other end is coupled to the voltage VCC. The source of the voltage clamping transistor 401 is coupled to one end of the resistor RE, the gate is coupled to the driving voltage VCLP, and the drain is coupled to the current mirror 460. The voltage VCLP is input to the gate of the voltage clamping transistor 401, such that the voltage of the source terminal is clamped to a voltage VC. The voltage clamping transistor 401 is connected in series with the external resistor RE, so as to conduct the current I2 (with a current value of [(VCC−VC)/RE]) to the current mirror 460. The current mirror 460 includes transistors 403, 404, 405_1~405_n, where the width-length ratio of the transistor 403 to the transistor 404 is N/M. The current mirror 460 can output a third current I3 by the input the second current I2. The current value of I3 is I2*(M/N). The control signal controls the ON/OFF of switches SW45_1~SW45_n corresponding to the transistors 405_1~405_n for fine-tuning the current I3 generated by the current mirror. For example, any width-length ratio of the transistor 404 and the transistor 405 is M:1. If y switches are ON (y is an integer), the current value of I3 is I2*[(M+y)/N]. According to this embodiment, the fine-tuning design of the current mirror 460 may further increase precision and adaptability of the impedance match circuit.

The source of the voltage clamping transistor 402 is coupled to the impedance detect circuit 410. The gate is coupled to the driving voltage VCLP. The drain is coupled to the input end of the current comparator 420. The voltage VCLP is input to the voltage clamping transistor 402, so as to clamp the voltage of the source end to be a voltage VD. If the voltage VC is equal to the voltage VD, the voltage clamping transistor 402 is connected in series with the impedance detect circuit 410 to conduct the current I1. If the impedance detect circuit 410 does not achieve the impedance match value, the maximum possible value of the current I1 is not equal to the maximum possible value of the current I3.

The impedance detect circuit 410 includes a first basic impedor RR1, first switches SWA1, SWA2 . . . SWAn, and second basic impedors RA1, RA2 . . . RAn. It is assumed that the basic impedors RA1, RA2 . . . RAn have the same impedance value. The impedance RR1 is connected in series between the reference voltage VCC and the source of the voltage clamping transistor 402. One end of the impedance RA1, RA2 . . . RAn is coupled to the reference voltage VCC, another end is coupled to one end of the first switch SWA1, SWA2 . . . SWAn, and another end of the first switch SWA1, SWA2 . . . SWAn is coupled to the source end of the second voltage clamping transistor 402. The successive approximation controller 430 controls the ON/OFF of the first switches SWA1, SWA2 . . . SWAn to control the equivalent impedances formed by the impedance RR1 and the impedances RA1, RA2 . . . RAn. Herein, the impedance value of parallel connected impedances RA1~RAn is set to be RA. The impedance value RA changes in accordance with the ON/OFF state of the first switches SWA1, SWA2 . . . SWAn. The voltage clamping transistor 402 clamps the voltage of the source end into a voltage VD, thus the first current I1 output from the impedance detect circuit 410 is (VCC−VD)/(RR1//RA).

When the impedance detect circuit 410 does not find the proper impedance match value, the possible maximum current I1 of the impedance match circuit 410 is different from the possible maximum current I3 of the current mirror 460, thus causing the value of the input voltage VE of the current comparator 420 to rise or causing the value of the input voltage VE of the current comparator 420 to drop. The current comparator 420 is implemented using a Schmitt trigger. The current comparator 420 transmits the compared result of the currents I1 and I3 to the successive approximation controller 430. If the current I1 is not equal to the current I3, the successive approximation controller 430 turns on the first switches SWA1, SWA2 . . . SWAn successively according to this compare result to change the impedance value RA. For example, when I1 is smaller than I3, the number of ON-state switches SWA1~SWAn is increased gradually, such that the RA value becomes small, and the I1 value becomes large. Until the current value of the current I1 is most approximate to the current value of the current I3, the current comparator 420 changes the state to make the successive approximation controller 430 terminate the approaching action, such that the impedance detect circuit 410 can obtain the desired resistance value. As known form the aforementioned content, current I1=(VCC−VD)/(RR1//RA), and current I3=I2*(M/N)=[(VCC−VC)*M/(RE*N)]. When approaching to the end, the current I1 is approximately equal to the current I3, thus the equivalent resistance value of the impedance detect circuit 410 is (RR1//RA)=RE*(N/M). Then, the ON/OFF of the first switches SWA1, SWA2 . . . SWAn corresponding to the impedance value of the impedance detect circuit 410 are stored in the register 450. At this moment, an enable signal controls the register 450 to deliver the ON/OFF states of the switches SWA1, SWA2 . . . SWAn to the impedance combination circuit 440, so as to control the ON/OFF states of the switches SWB1~SWBn of the impedance combination circuit 440. By using the manner of gradually approaching to find the match impedance value, elements are saved, and also the effect of high precision is achieved.

The impedance combination circuit 440 includes a basic impedor RR3, switches SWB1, SWB2 . . . SWBn and basic impedors RB1, RB2 . . . RBn. The basic impedor RR3 is connected in series with the reference voltage VCC and an output/input pin I/O. One end of the basic impedors RB1, RB2 . . . RBn is coupled to the reference voltage VCC, and another end is coupled to the second switches SWB1, SWB2 . . . SWBn. Another end of the second switches SWB1, SWB2 . . . SWBn is coupled to the output/input pin I/O. The basic impedors RB1, RB2 . . . RBn are assumed to have same impedance value.

The ON/OFF states of the switches SWB1, SWB2 . . . SWBn replicate the ON/OFF states of the first switches SWA1, SWA2 . . . SWAn via the register 450. The ON/OFF of the switches SWB1, SWB2 . . . SWBn controls the equivalent impedance of the basic impedor RR3 and the basic impedors RB1, RB2 . . . RBn. For example, when the approaching is end, the switches SWA1 and SWA2 are ON, and other switches SWA3~SWAn are OFF. Herein, the impedance detect circuit 410 obtains a preferred impedance match value. The switches SWB1 and SWB2 of the impedance combination circuit 440 are also turned on via the register 450 (other switches SWB3~SWBn are OFF), so as to obtain a same impedance match value. Herein, the impedance combination circuit 440 completely replicates the equivalent resistance value of the impedance detect circuit 410, and outputs it at the output/input pin I/O. In order to further increase precision, the impedance combination circuit 440 and the impedance detect circuit 410 have the same impedance architecture, for example, the layout of the integrated circuits are completely the same. The implementation of each of the basic impedors RR1, RA1~RAn, RR3, RB1~RBn is, for example, a chip resistor.

A signal receiver according to an embodiment of the present invention includes an impedance match circuit for generating an impedance match value related to the external impedance. When the signal receiver receives signals, the impedance of an external signal transmission device is matched to obtain the best transmission effect. The impedance match circuit of the signal receiver includes an impedance detect circuit, a current mirror, a current comparator, a successive approximation controller, and an impedance combination circuit. The impedance detect circuit detects the external impedance. The current of the external impedance mirrors the detect current to the current comparator by the current mirror to be compared with the current of the impedance detect circuit. The successive approximation controller gradually adjusts the impedance value of the impedance detect circuit according to the compared result until a preferred match impedance value is obtained. The detected result is then replicated to the impedance combination circuit to be output as a same impedance value.

In view of the above, in the present invention, as the impedance match circuit having high precision without being affected by the manufacturing process employs the impedance detect circuit 410 to couple the current comparator 420, the current comparator 420 drives the correction mode of the successive approximation controller 430, and the impedance detect circuit 410 and the impedance combination circuit 440 have the same impedance architecture, the impedance match value has high precision without being affected by temperature, manufacturing process, and voltage. Meanwhile, this impedance match structure is easy to be achieved, such that the number of elements is greatly reduced. Furthermore, the number of the impedance combination circuit 440 is not limited to one. In the situation of using multi-channel, multiple groups of the same impedance combination circuits 440 can be used.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An impedance match circuit for generating an impedance match value related to an external impedance, comprising:
    an impedance detect circuit, detecting the external impedance to obtain a first impedance in proportion to the external impedance and outputting a first current;
    a current comparator, responding to the first current and a second current flowing through the external impedance to generate a compared result;
    a successive approximation controller, controlling the first impedance of the impedance detect circuit according to the compared result of the current comparator to obtain the desired first impedance; and
    an impedance combination circuit, replicating the impedance combination structure of the impedance detect circuit to obtain the impedance match value in proportion to the external impedance, wherein a ratio of the first impedance to the external impedance combine with a ratio of the impedance match value to the external impedance constitute a first predetermined proportion.

2. The impedance match circuit as claimed in claim 1, further comprising a register for registering the impedance combination structure of the impedance detect circuit to control the impedance combination circuit.

3. The impedance match circuit as claimed in claim 1, further comprising a current mirror for mirroring the second current to obtain a third current, wherein the current comparator compares the first current with the third current to generate the compared result.

4. The impedance match circuit as claimed in claim 3, further comprising:
    a first voltage clamping transistor, connected in series with the external impedance and conducting the second current to the current minor; and
    a second voltage clamping transistor, connected in series with the impedance detect circuit and conducting the first current.

5. The impedance match circuit as claimed in claim 4, wherein the impedance detect circuit comprises:
    a first basic impedor, connected in series between a reference voltage source and the second voltage clamping transistor;
    a plurality of first switches;
    a plurality of second basic impedors, with one end coupled to the reference voltage source and the other end coupled to one end of each first switch, wherein the other end of each first switch is coupled to the second voltage clamping transistor, the successive approximation controller controls the ON/OFF of each first switch to control an equivalent impedance combined of the first basic impeder and the second basic impedors, and the equivalent impedance is the first impedance.

6. The impedance match circuit as claimed in claim 5, wherein the impedance combination circuit comprises:
    a third basic impedor, connected in series between the reference voltage source and an output/input pin;
    a plurality of second switches;
    a plurality of fourth basic impedors, with one end coupled to the reference voltage source and the other end coupled to one end of each second switch, wherein the other end of each second switch is coupled to the output/input pin, the ON/OFF states at the second switches replicate the ON/OFF states of the first switches, the ON/OFF of each second switch controls an equivalent impedance combined of the third basic impedor and the fourth basic impedors, and the equivalent impedance is the impedance match value.

7. The impedance match circuit as claimed in claim 1, wherein the impedance combination circuit and the impedance detect circuit have the same impedance architecture.

8. A signal receiver, comprising
    an impedance match circuit, generating an impedance match value related to an external impedance, the impedance match circuit comprising:
    an impedance detect circuit, detecting the external impedance to obtain a first impedance in proportion to the external impedance, and outputting a first current;
    a current mirror, mirroring a second current flowing through the external impedance to obtain a third current;
    a current comparator, comparing the first current with the third current to generate a compared result;
    a successive approximation controller, controlling the first impedance of the impedance detect circuit according to the compared result of the current comparator to obtain the desired first impedance; and
    an impedance combination circuit, replicating the impedance combination structure of the impedance detect circuit to obtain the impedance match value in proportion to the external impedance, wherein a ratio of the first impedance to the external impedance combine with a ratio of the impedance match value to the external impedance constitute a first predetermined proportion.

9. The signal receiver as claimed in claim 8, wherein the impedance match circuit further comprises a register for registering the impedance combination structure of the impedance detect circuit to control the impedance combination circuit.

10. The signal receiver as claimed in claim 8, wherein the impedance match circuit further comprises:
    a first voltage clamping transistor, connected in series with the external impedance and conducting the second current to the current minor; and
    a second voltage clamping transistor, connected in series with the impedance detect circuit and conducting the first current.

11. The signal receiver as claimed in claim 8, wherein the impedance detect circuit comprises:
    a first basic impedor, connected in series between a reference voltage source and the second voltage clamping transistor;
    a plurality of first switches;
    a plurality of second basic impedors, with one end coupled to the reference voltage source and the other end coupled to one end of each first switch, wherein the other end of each first switch is coupled to the second voltage clamping transistor, the successive approximation controller controls the ON/OFF of each first switch to control an equivalent impedance combined of the first basic impedor and the second basic impedors, and the equivalent impedance is the first impedance.

12. The signal receiver as claimed in claim 8, wherein the impedance combination circuit comprises:
- a third basic impedor, connected in series between the reference voltage source and an output/input pin;
- a plurality of second switches;
- a plurality of fourth basic impedors, with one end coupled to the reference voltage source and the other end coupled to one end of each second switch, wherein the other end of each second switch is coupled to the output/input pin, the ON/OFF states of the second switches replicate the ON/OFF states of the first switches, the ON/OFF of each second switch controls an equivalent impedance combined of the third basic impedor and the fourth basic impedors, and the equivalent impedance is the impedance match value.

13. The signal receiver as claimed in claim 8, wherein the impedance combination circuit and the impedance detect circuit have the same impedance architecture.

* * * * *